(12) United States Patent
Villanueva et al.

(10) Patent No.: US 11,744,026 B1
(45) Date of Patent: Aug. 29, 2023

(54) CHASSIS HOUSING AND SUPPORT STRUCTURES TO SECURE A CIRCUIT BOARD WITHIN THE CHASSIS HOUSING

(71) Applicant: Appleton Grp LLC, Rosemont, IL (US)

(72) Inventors: Darwin A. Villanueva, Cavite (PH); Valerie B. Comia, Rizal (PH); Mark Chester B. Nepomuceno, Rizal (PH); Joel Jeremiah G. Atienza, Bulacan (PH); Klaus Weinmann, Gersthofen (DE)

(73) Assignee: Appleton Grp LLC, Rosemont, IL (US)

( * ) Notice: Subject to any disclaimer, the term of this patent is extended or adjusted under 35 U.S.C. 154(b) by 0 days.

(21) Appl. No.: 17/880,107

(22) Filed: Aug. 3, 2022

(51) Int. Cl.
*H05K 5/00* (2006.01)
*H05K 7/14* (2006.01)
*H05K 5/06* (2006.01)

(52) U.S. Cl.
CPC ........... *H05K 5/006* (2013.01); *H05K 5/0052* (2013.01); *H05K 5/069* (2013.01); *H05K 7/1452* (2013.01)

(58) Field of Classification Search
CPC .................................................. H05K 5/0052
See application file for complete search history.

(56) References Cited

U.S. PATENT DOCUMENTS

| | | |
|---|---|---|
| 5,973,926 A | 10/1999 | Sacherman et al. |
| 6,369,320 B1 * | 4/2002 | Okamoto ............. H05K 5/0017 174/DIG. 35 |
| 6,381,149 B1 | 4/2002 | Megason et al. |
| 6,751,102 B1 | 6/2004 | Chen |
| 6,937,475 B2 | 8/2005 | Rigimbal et al. |
| 7,004,764 B2 | 2/2006 | Boudreau et al. |
| 7,048,564 B1 * | 5/2006 | Hinze ................ H01R 13/5213 361/742 |
| 7,072,176 B2 | 7/2006 | Lin et al. |
| 7,344,385 B2 | 3/2008 | Chen |
| 7,385,830 B2 | 6/2008 | Liu et al. |
| 8,553,425 B2 | 10/2013 | Li et al. |
| 8,995,130 B2 | 3/2015 | Hosoda |
| 9,345,162 B2 | 5/2016 | Fan |
| 10,131,296 B2 | 11/2018 | Hara et al. |
| 10,292,222 B2 | 5/2019 | Badia |
| 10,660,230 B2 | 5/2020 | Kuroiwa et al. |
| 10,959,343 B2 | 3/2021 | Cayou |
| 2004/0014337 A1 * | 1/2004 | Throum ............... H05K 5/0052 439/76.1 |

(Continued)

FOREIGN PATENT DOCUMENTS

| | | |
|---|---|---|
| EP | 1398563 B1 | 2/2006 |
| WO | 2018014856 A1 | 1/2018 |

*Primary Examiner* — Hung V Ngo
(74) *Attorney, Agent, or Firm* — McDonnell Boehnen Hulbert & Berghoff LLP (57) ABSTRACT

An electrical enclosure including a housing having a plurality of side walls and a base, a housing cover positioned over, and secured to, the housing, a circuit board positioned between the housing and the housing cover, a plurality of connectors extending through the housing cover and the circuit board and into the housing, the plurality of connectors securing the housing cover and the circuit board to the housing, a first protrusion extending inwardly from a first side wall of the housing, and a second protrusion extending inwardly from a second side wall of the housing.

20 Claims, 5 Drawing Sheets

(56) References Cited

U.S. PATENT DOCUMENTS

| | | | |
|---|---|---|---|
| 2011/0170269 A1* | 7/2011 | Blossfeld | H01R 13/6658 |
| | | | 361/752 |
| 2020/0245480 A1* | 7/2020 | Mauger | H05K 5/0056 |
| 2021/0219440 A1* | 7/2021 | Larsen | H05K 5/0247 |
| 2021/0329805 A1 | 10/2021 | Lai et al. | |

* cited by examiner

CHASSIS HOUSING AND SUPPORT STRUCTURES TO SECURE A CIRCUIT BOARD WITHIN THE CHASSIS HOUSING

FIELD

The present disclosure generally relates to a chassis housing and support structures to a secure a circuit board in an electrical enclosure. More particularly, the present disclosure relates to a chassis housing and support structures that may be used in industrial power supply units, such as a Power Supply Unit (PSU).

BACKGROUND

The background information herein below relates to the present disclosure but is not necessarily prior art.

Industrial power supplies tend to experience different kinds of mechanical disturbances like shock and vibrations due to the nature of the application in the field and during transport. These external factors can cause power supply units to have loosen connections and cause component failures that can ultimately lead to equipment malfunction. Considering real-world situations, power supply units need to comply with relevant regulations and standards to withstand mechanically hostile environments without wearing out and eventually breaking down. To meet these requirements and to ensure that the PSU is always in good condition, designers must implement ways that can eliminate and/or reduce the effects of any external mechanical disturbances.

In addition, where a Printed Circuit Board (PCB or circuit board) in an industrial power supply unit is not properly secured within the unit, there is also the undesirable likelihood of having bent connector pins due to the process of insertion of the connector pins into mating connectors, especially for devices serving in a backplane system. The undesirable bent connector pins may be caused by misaligned connector pins resulting from an unsteadily positioned circuit board being pressed into the mating terminal.

Therefore, there is a need for providing a chassis mounting support structure to secure a circuit board within an electrical enclosure to eliminate and/or reduce the effects of any external mechanical disturbances, as well as providing a secured circuit board within the electrical enclose to eliminate and/or reduce the possibility of having bent connector pins during the process of insertion of the connector pins into mating connectors.

SUMMARY

The present embodiments disclose chassis and circuit board securement structures and methods used to secure a circuit board within an electrical enclosure to withstand mechanical shocks and vibrations that may be experienced by the power supply unit to ensure the structural soundness and overall reliability of the industrial power supply unit in its intended applications. In addition, having a fixed and securely positioned circuit board in the electrical enclosure allows for proper alignment of connector pins to mating connectors which, in turn, eliminates and/or reduces the occurrence of bent connector pins during the insertion process.

The present embodiments provide a method of enclosure design in which the support and mounting structures provide means of securing the position of a circuit board inside a chassis housing to advantageously eliminate and/or reduce the effects of external mechanical disturbances, such as shock and vibrations. To achieve this goal, two separate types of structures may be used that allow the circuit board to be securely attached to the chassis housing. The first structures include protrusions that extend inwardly from side walls of the chassis housing that may extend to connector receptacles (also referred to as standoffs). The protrusions form a mounting guide and support for the circuit board. The circuit board includes cutouts that extend around an exterior of the protrusions to fix the circuit board in a proper alignment within the chassis housing. The second structures are small protrusions on the chassis housing cover that act as a support by pressing the circuit board towards the corner cutouts or ledges on the other half of the chassis housing of the electrical enclosure eliminating room for any movement of the circuit board with respect to the chassis housing. Although they may be used on their own without the other, these two separate structures work together by preventing left-right and top-bottom movements caused by any external mechanical disturbance forces, and also fix the circuit board in proper alignment within the chassis housing.

In one aspect, an electrical enclosure is provided including a housing having a plurality of side walls and a base; a housing cover positioned over, and secured to, the housing; a circuit board positioned between the housing and the housing cover; a plurality of connectors extending through the housing cover and the circuit board and into the housing, the plurality of connectors securing the housing cover and the circuit board to the housing; a first protrusion extending inwardly from a first side wall of the housing; and a second protrusion extending inwardly from a second side wall of the housing.

In another aspect, an electrical enclosure is provided including a housing having a plurality of side walls and a base; a housing cover positioned over, and secured to, the housing; a circuit board positioned between the housing and the housing cover; a plurality of connectors extending through the housing cover and the circuit board and into the housing, the plurality of connectors securing the housing cover and the circuit board to the housing; a first downwardly extending protrusion positioned on an underside of a first end of the housing cover; a second downwardly protrusion positioned on the underside of the first end of the housing cover; wherein the first and second downwardly extending protrusions contact a bottom surface of the circuit board.

In a further aspect, a method is provided including (i) providing an electrical enclosure having a housing having a plurality of side walls and a base; a housing cover positionable over, and securable to, the housing; a circuit board positionable between the housing and the housing cover; a plurality of connectors extendable through the housing cover and the circuit board and into the housing; a first protrusion extending inwardly from a first side wall of the housing; (ii) a second protrusion extending inwardly from a second side wall of the housing; wherein the first protrusion extends to a first connector receptacle; and wherein the second protrusion extends to a second connector receptacle; (iii) positioning the circuit board over the housing and positioning first and second cutouts on the circuit board around an exterior of the first and second protrusions; (iv) positioning the housing cover over the circuit board; and (v) extending the plurality of connectors through the housing cover and circuit board and into the first and second connector receptacles to secure the housing cover and circuit board to the housing.

These as well as other aspects, advantages, and alternatives will become apparent to those of ordinary skill in the art by reading the following detailed description with reference where appropriate to the accompanying drawings. Further, it should be understood that the description provided in this summary section and elsewhere in this document is intended to illustrate the claimed subject matter by way of example and not by way of limitation.

DETAILED DESCRIPTION

Embodiments, of the present disclosure, will now be described with reference to the accompanying Figures.

Figure 1:
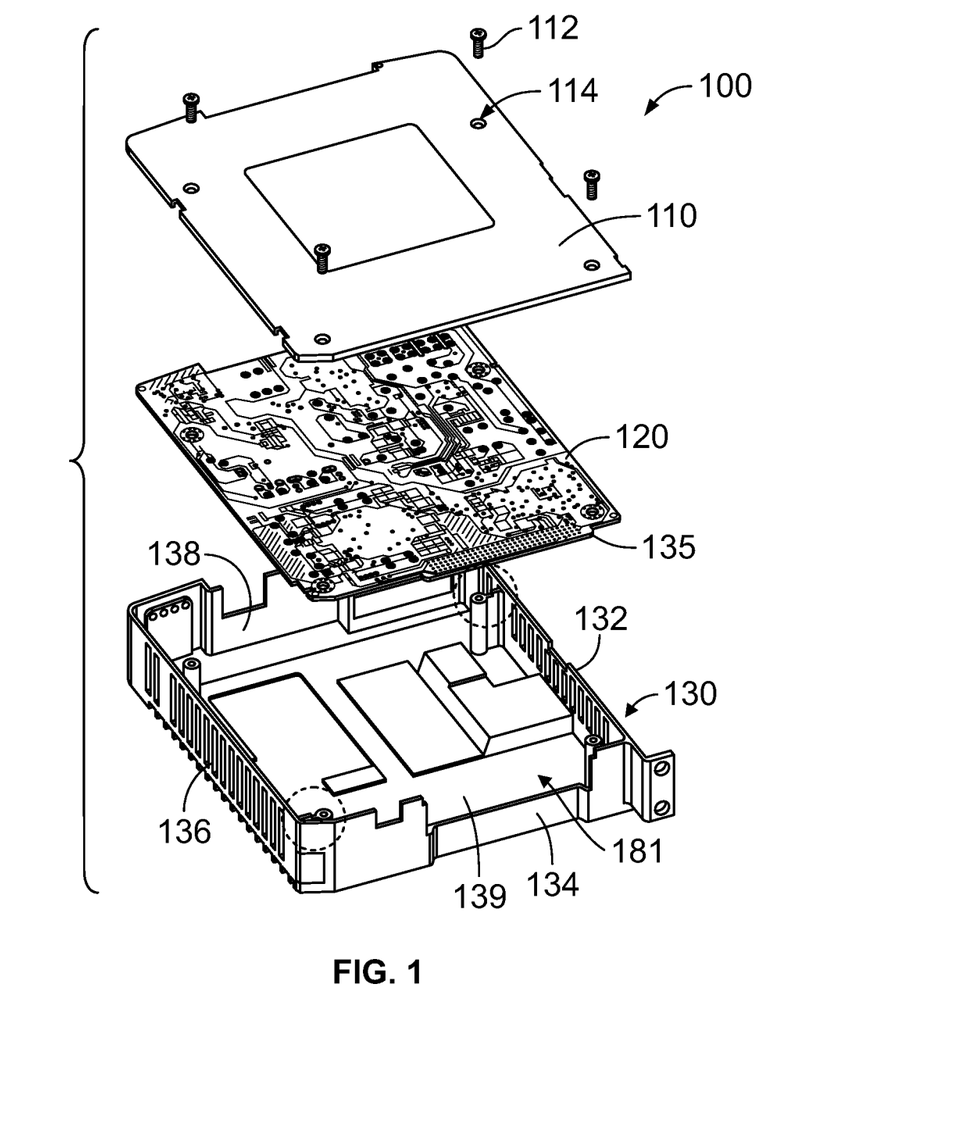
FIG. 1 is an exploded perspective view of electrical enclosure 100 having a housing 130, circuit board 120, and housing cover 110.

FIG. 1 is an exploded perspective view of electrical enclosure 100 having a housing 130, circuit board 120, and housing cover 110. Circuit board 120 is shown bottom side up and is positioned between housing 130 and housing cover 100. A plurality of connectors 112 extend through holes 114 in housing cover 110 and holes in circuit board 120 and into connector receptacles positioned in housing 130. The connectors 112 secure the housing cover 110 and circuit board 120 to housing 130. The connectors 112 may have, but are not required to have, external threads that mate with internal threads positioned in the connector receptacles positioned in housing 130. Housing 130 includes side walls 132, 134, 136, and 138 that extend upwardly from base 139 of housing 130. Circuit board 120 includes an extension 135 that extends from an edge of the circuit board 120 and extends through an opening 181 above side wall 134.

The housing 130 may be used in an electrical enclosure, such as a Power Supply Unit (PSU). However, housing 130 may be used in many types of enclosures, and is not limited to use in a PSU. In addition, the housing 130 and housing cover 110 may be a die-cast metal chassis housing and housing cover. Furthermore, the housing 130 and housing cover 100 are not limited to a specific material, such as metal, and can be made of molded or formed plastic or machine-processed materials, and could be 3D printed as well. It should also be noted that the shape and configuration of the housing 130 and housing cover 110 may be varied widely and are not limited to those shown in the Figures.

Figure 2A:
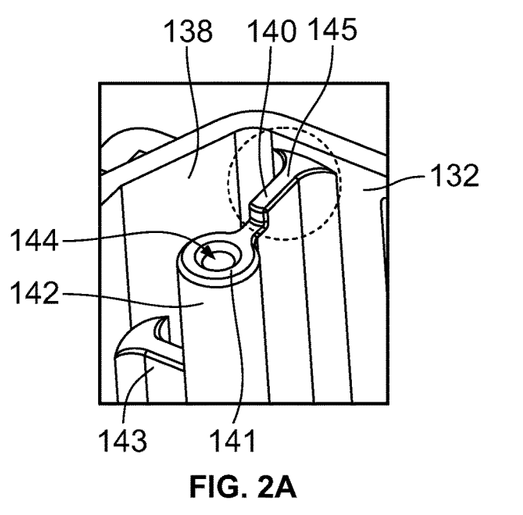
FIG. 2A is a close up perspective view of a portion of housing 130 shown in FIG. 1.

FIG. 2A is a close up perspective view of a portion of housing 130 shown in FIG. 1. A protrusion 140 is shown extending inwardly from side wall 132 within housing 130. The protrusion 140 extends to connector receptacle 142 that includes a connector aperture 144 to receive an end of connector 112. Connector aperture 144 may have internal threads to mate with external threads on connector 112. A support member 143 is shown extending inwardly from side wall 138 and is attached to connector receptacle 142 that serves to further support connector receptacle 142 above base 139 of housing 130. Protrusion 140 has a top surface 145 that has a height above base 139 of housing 130 that is greater than a height of a top surface 141 of connector receptacle 142 above the base 139. Once the electrical enclosure 100 is assembled, cutout 160 (shown in FIG. 3A) of circuit board 120 extends around an exterior of the protrusion 140 and the circuit board 120 rests upon and is in contact with the top surface 141 of connector receptacle 142. Preferably, the top surface 145 of protrusion 140 is coplanar with an upper surface of circuit board 120.

Figure 2B:
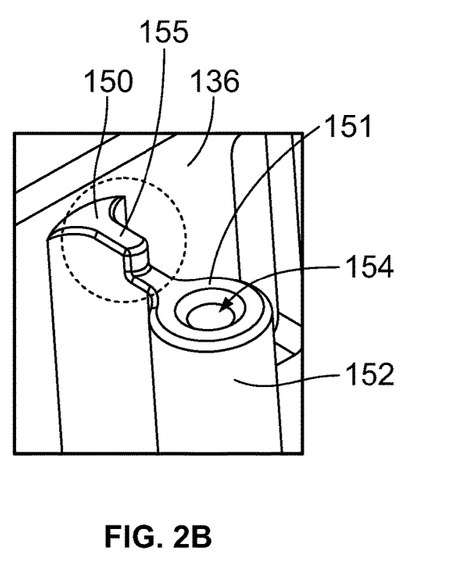
FIG. 2B is a close up perspective view of another portion of housing 130 shown in FIG. 1.

FIG. 2B is a close up perspective view of another portion of housing 130 shown in FIG. 1. A protrusion 150 is shown extending inwardly from side wall 136 within housing 130. The protrusion 150 extends to connector receptacle 152 that includes a connector aperture 154 to receive an end of connector 112. Connector aperture 154 may have internal threads to mate with external threads on connector 112. Protrusion 150 has a top surface 155 that has a height above base 139 of housing 130 that is greater than a height of a top surface 151 of connector receptacle 152 above the base 139. Once the electrical enclosure 100 is assembled, cutout 162 (shown in FIG. 3B) extends around an exterior of the protrusion 150 and the circuit board 120 rests upon and is in contact with the top surface 151 of connector receptacle 152. Preferably, the top surface 155 of protrusion 150 is coplanar with an upper surface of circuit board 120.

Figure 3A:
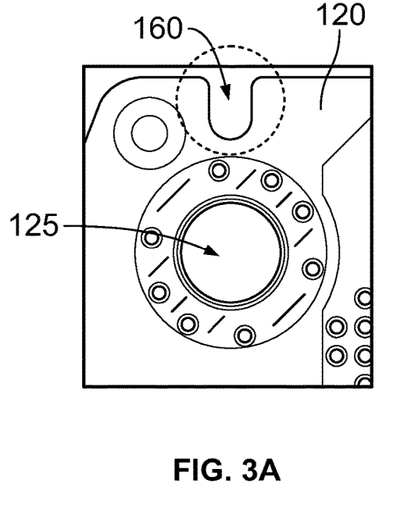
FIG. 3A is a close up top view of a portion of circuit board 120 having cutout 160 and connector through hole 125.
Figure 3B:
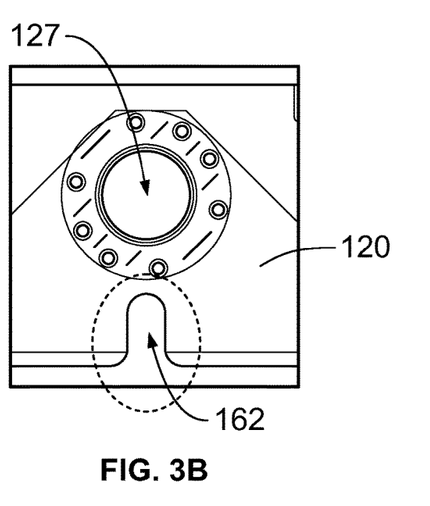
FIG. 3B is a close up top view of another portion of circuit board 120 having cutout 162 and connector through hole 127.

FIG. 3A is a close up top view of a portion of circuit board 120 having cutout 160 and connector through hole 125; and FIG. 3B is a close up top view of another portion of circuit board 120 having cutout 162 and connector through hole 127. As noted above, cutout 160 extends around an exterior of protrusion 140 when the circuit board 120 is positioned within housing 130, and cutout 162 extends around an exterior of protrusion 150 when the circuit board 120 is positioned within housing 130. Circuit board 120 includes a through hole 125 near cutout 160 through which connector 112 extends upon assembly, and circuit board 120 also includes a through hole 127 near cutout 162 through which connector 112 extends upon assembly. The areas around through holes 125 and 127 are reinforced to provide for additional strength to the circuit board 120 around those through holes.

Figure 4A:
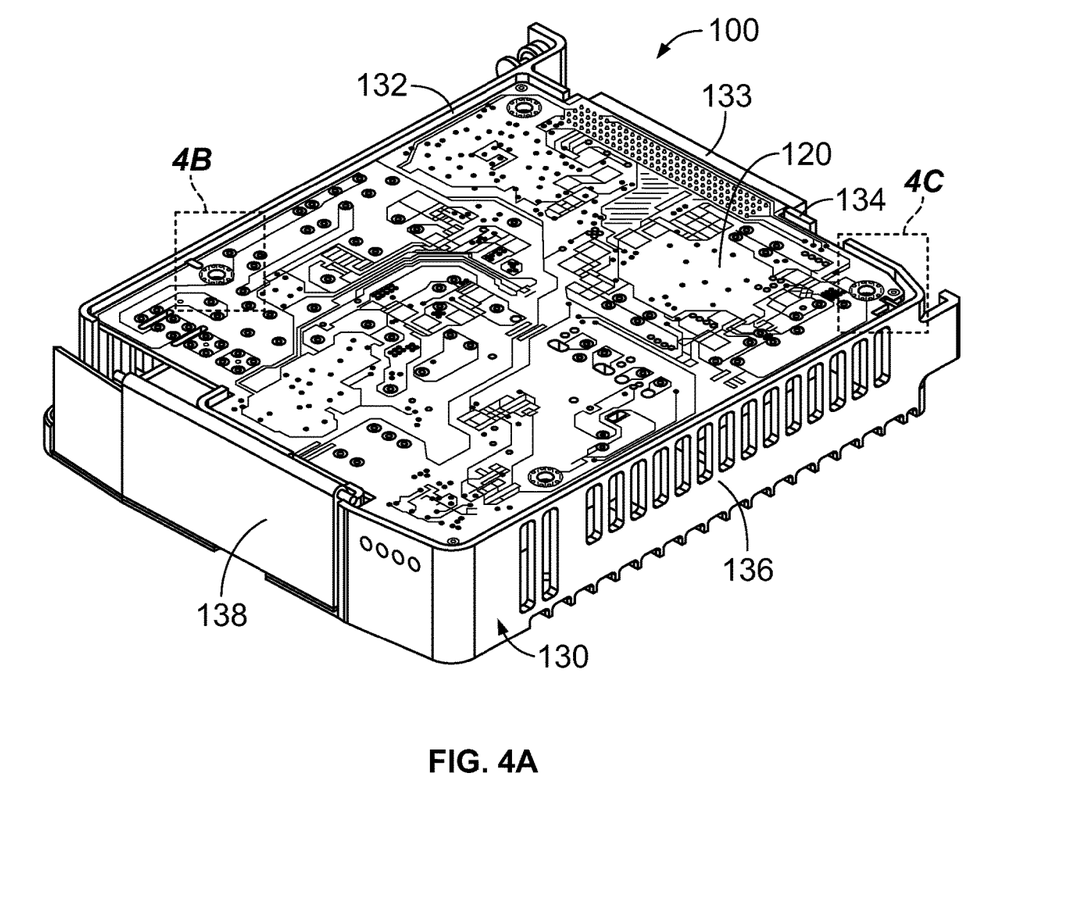
FIG. 4A is a perspective view of electrical enclosure 100 with circuit board 120 positioned within housing 130.
Figure 4B:
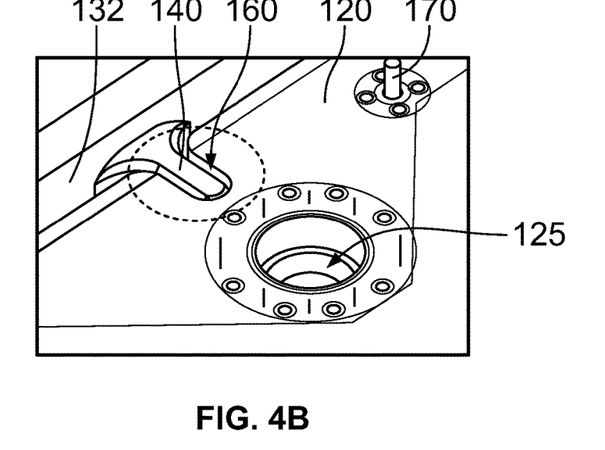
FIG. 4B is a close up perspective view of portion 4B shown in FIG. 4A.
Figure 4C:
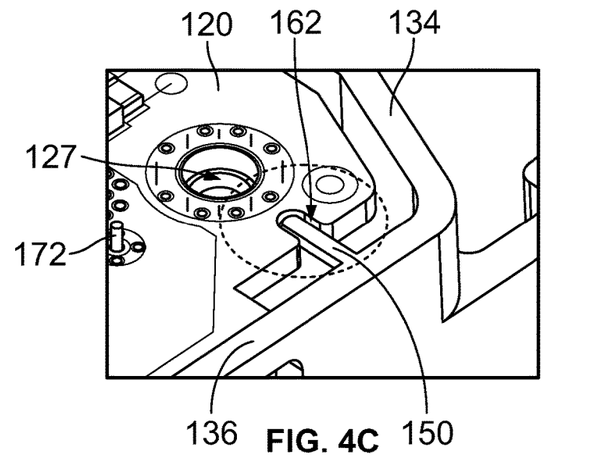
FIG. 4C is a close up perspective view of portion 4C shown in FIG. 4A.

FIG. 4A is a perspective view of electrical enclosure 100 with circuit board 120 positioned in housing 130; FIG. 4B is a close up perspective view of portion 4B shown in FIG. 4A; and FIG. 4C is a close up perspective view of portion 4C shown in FIG. 4A. Circuit board 120 is shown positioned within side walls 132, 134, 136, and 138 of housing 130. Backplane connector interface 133 is shown extending through opening 181 above side wall 134. In FIG. 4B, protrusion 140 is shown inwardly extending from side wall 132 and cutout 160 of circuit board 120 extends around an exterior of protrusion 140. Connector through hole 125 in circuit board 120 is shown near cutout 160 and a capacitor lead 170 is shown extending through an opening in circuit board 120. Similarly, in FIG. 4C, protrusion 150 is shown inwardly extending from side wall 136 and cutout 162 of circuit board 120 extends around an exterior of protrusion 150. Connector through hole 127 in circuit board 120 is shown near cutout 162 and a capacitor lead 172 is shown extending through an opening in circuit board 120.

Protrusions 140 and 150 that inwardly extend from side walls of the housing 130 provide a form of a mounting guide for the circuit board 120. Protrusions 140 and 150 are also attached to the base 139 of housing 130 and provide mechanical support for the connector receptacles or stand-offs 142 and 152. In addition, an exterior of protrusions 140 and 150 dictates the size and shape of cutouts 160 and 162 on circuit board 120 to allow the protrusions 140 and 150 to fit within the cutouts 160 and 162. The combination of protrusions 140 and 150 along with the cutouts 160 and 162 on the circuit board 120 holds the circuit board 120 in place and prevents movement of the circuit board 120 within housing 130. The protrusions 140 and 150 and cutouts 160 and 162 of circuit board 120 not only serve to secure the circuit board 120 in place within housing 130, but also aid in proper alignment of circuit board 120 within housing 130 during the assembly process.

Figure 5:
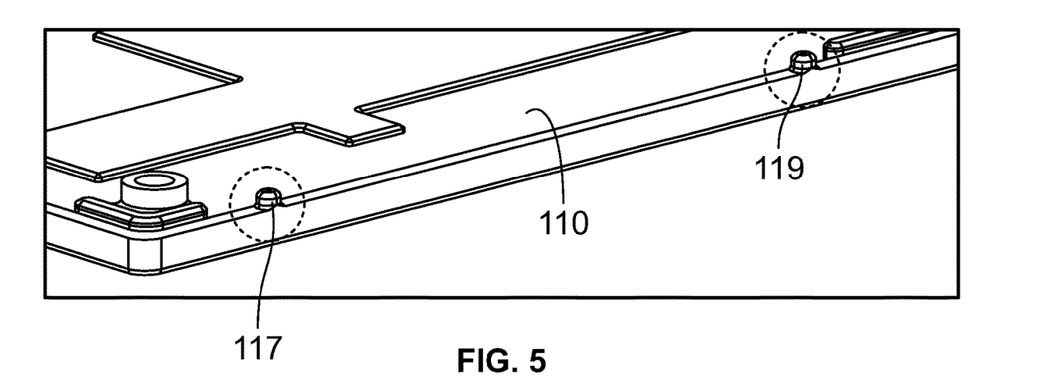
FIG. 5 is a close up perspective view of an underside of a portion of housing cover 110 with downwardly extending protrusions 117 and 119.

FIG. 5 is a close up perspective view of an underside of a portion of housing cover 110 with downwardly extending protrusions 117 and 119. An end of housing cover 110 includes protrusions 117 and 119 that extend downwardly from the bottom surface of circuit board 120. Once the electrical enclosure 100 is assembled, the protrusions 117 and 119 directly face and contact the bottom surface of the circuit board 120 (as shown in FIGS. 6B and 6C). The protrusions 117 and 119 function as a support that prevents the circuit board 120 from moving relative to housing 130 and serve to force the circuit board 120 into secure engagement with housing 130 by resting upon ledges 185 and 183 on top of side wall 134 beneath opening 181 above side wall 134.

Figure 6A:
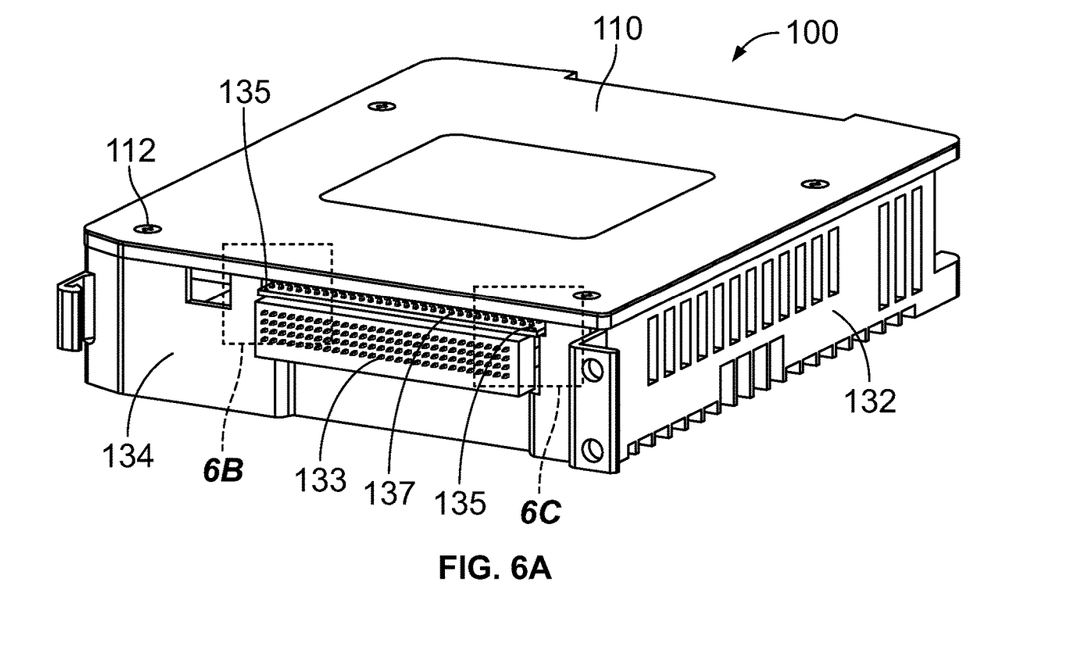
FIG. 6A is a perspective view of electrical enclosure 100, in an assembled state.
Figure 6B:
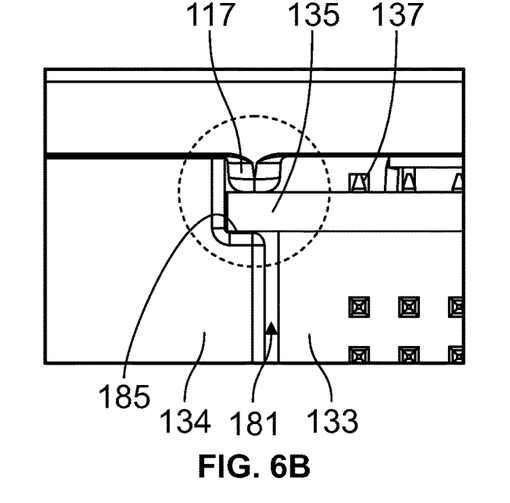
FIG. 6B is a close up side view of portion 6B shown in FIG. 6A.
Figure 6C:
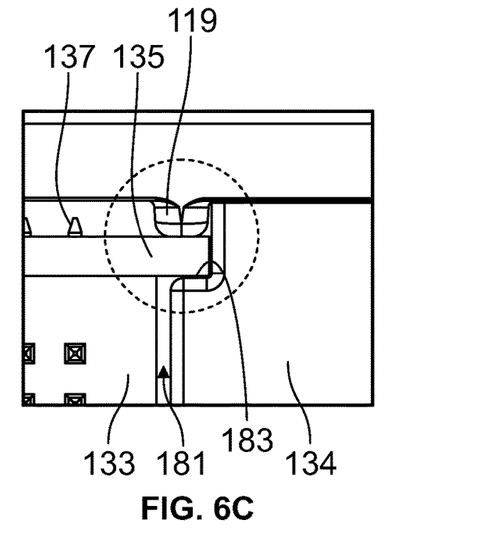
FIG. 6C is a close up side view of portion 6C shown in FIG. 6A.

FIG. 6A is a perspective view of electrical enclosure 100 shown in an assembled state. Housing cover 110 is positioned over housing 130 and secured to housing 130 with connectors 112. Extension 135 of circuit board 120 extends through opening 181 above side wall 134, and extension 135 is shown with electrical elements 137 above extension 135. In addition, backplane connector 133 is shown extending through the opening 181 above side wall 134 and beneath extension 135 of circuit board 120.

FIG. 6B is a close up side view of portion 6B shown in FIG. 6A; and FIG. 6C is a close up side view of portion 6C shown in FIG. 6A. Protrusions 117 and 119 extending downwardly from housing cover 110 contact and press down on an upper surface extension 135 of circuit board 120.

Once the electrical enclosure 100 is assembled, the extension 135 of circuit board 120 extends through opening 181 above side wall 134. Edges of extension 135 of circuit board 120 rest on ledges 185 and 183 on the top of side wall 134. When housing cover 110 is secured to housing 130, downwardly extending protrusions 117 and 119 press down on the edges of extension 135 to clamp the extension 135 of circuit board 120 between the downwardly extending protrusions 117 and 119 and ledges 185 and 183 on top of side wall 134. Backplane connector 133 also extends through opening 181 above side wall 134 below extension 135 of circuit board 120 and above side wall 134. The downwardly extending protrusions 117 and 119 function as a support that prevents the circuit board from moving sideways relative to the housing when the electrical enclosure 100 is in a normal upright position.

The protrusions 140 and 150 extending inwardly from side walls of housing 130, and the protrusions 117 and 119 downwardly extending from a bottom surface of housing cover 110 secure the circuit board 120 in place within housing 130 and enable the electrical enclosure assembly 100 to withstand all kinds of shock and mechanical disturbances while in transport and during its intended application in the field.

As a whole, the construction of the components of electrical enclosure 100 described above secure the circuit board 120 within housing 130 firmly in place to withstand different directions of shock and mechanical vibrations—left-right and top-bottom—movements. The construction also serves to align the circuit board 120 properly within housing 130 to eliminate and/or reduce the likeliness of bending the connector pins during the process of inserting the connector pins to mating connector terminals. This alignment also ensures compatibility to allow for automated assembly of the circuit board 120 within housing 130.

The disclosed embodiments of the structure of the components of electrical enclosure 100 are integrated in forming the housing 130 of electrical enclosure 100, and the present design provides for a cost-effective method to securely position of the circuit board 120 within the housing 130. Furthermore, the disclosed embodiments of the electrical enclosure 100 does not require the use of an additional latching mechanism and therefore allows for easier mounting of circuit board 120 within housing 130 of electrical enclosure 100.

The construction of the electrical enclosure 100 prevents external mechanical disturbances like shock and vibrations from loosening connections, damaging solder joints and wearing out components in the circuit board 120. In addition, the disclosed electrical enclosure 100 properly aligns the backplane connector 133 extending from housing 130 to its mating connector, thereby eliminating the possibility of bending the connector pins during insertion into mating connectors. Furthermore, due to the alignment facilitated by the structure of the electrical enclosure 100, automated assembly of the circuit board 120 within housing 130 is possible.

In addition, the electrical enclosure 100 disclosed herein is applicable to all electronic devices with die-cast, machine-processed enclosures as well as molded plastic, machined-processed, and 3D printed housings.

Embodiments are provided so as to thoroughly and fully convey the scope of the present disclosure to the person skilled in the art. Numerous details are set forth, relating to specific components, and methods, to provide a complete understanding of embodiments of the present disclosure. It will be apparent to the person skilled in the art that the details provided in the embodiments should not be construed to limit the scope of the present disclosure. In some embodiments, well-known processes, well-known apparatus structures, and well-known techniques are not described in detail.

The terminology used, in the present disclosure, is only for the purpose of explaining a particular embodiment and such terminology shall not be considered to limit the scope of the present disclosure. As used in the present disclosure, the forms "a", "an", and "the" may be intended to include the plural forms as well, unless the context clearly suggests otherwise. The terms "comprises", "comprising", "including", and "having", are open ended transitional phrases and therefore specify the presence of stated features, elements, modules, units and/or components, but do not forbid the presence or addition of one or more other features, elements, components, and/or groups thereof.

When an element is referred to as being "mounted on", "engaged to", "connected to", or "coupled to" another element, it may be directly or indirectly on, engaged, connected or coupled to the other element. As used herein, the term "and/or" includes any and all combinations of one or more of the associated listed elements.

The terms first, second, third, etc., should not be construed to limit the scope of the present disclosure as the aforementioned terms may be only used to distinguish one element, component, region, or section from another element, component, region, or section. Terms such as first, second, third etc., when used herein do not imply a specific sequence or order unless clearly suggested by the present disclosure.

The foregoing description of the embodiments has been provided for purposes of illustration and not intended to limit the scope of the present disclosure. Individual components of a particular embodiment are generally not limited to that particular embodiment, but, are interchangeable. Such variations are not to be regarded as a departure from the present disclosure, and all such modifications are considered to be within the scope of the present disclosure.

While considerable emphasis has been placed herein on the components and component parts of the preferred embodiments, it will be appreciated that many embodiments can be made and that many changes can be made in the preferred embodiments without departing from the principles of the disclosure. These and other changes in the preferred embodiment as well as other embodiments of the disclosure will be apparent to those skilled in the art from the disclosure herein, whereby it is to be distinctly understood that the foregoing descriptive matter is to be interpreted merely as illustrative of the disclosure and not as a limitation.

We claim:

1. An electrical enclosure comprising:
   a housing having a plurality of side walls and a base;
   a housing cover positioned over, and secured to, the housing;
   a circuit board positioned between the housing and the housing cover;
   a plurality of connectors extending through the housing cover and the circuit board and into the housing, the plurality of connectors securing the housing cover and the circuit board to the housing;
   a first protrusion extending inwardly from a first side wall of the housing; and
   a second protrusion extending inwardly from a second side wall of the housing;
   wherein the circuit board includes first and second cutouts that extend around the first and second protrusions, respectively.

2. The electrical enclosure of claim 1, wherein the first protrusion extends to a first connector receptacle; and
   wherein the second protrusion extends to a second connector receptacle.

3. The electrical enclosure of claim 2, wherein the first and second connector receptacles have internal threads to receive external threads positioned on the plurality of connectors.

4. The electrical enclosure of claim 2, wherein the circuit board is in contact with the tops of the first and second connector receptacles.

5. The electrical enclosure of claim 2, wherein a support member extends inwardly from one of the plurality of side walls to the first connector receptacle.

6. The electrical enclosure of claim 1, wherein the circuit board has an extension extending from an edge of the circuit board and extends through an opening in one of the plurality of sidewalls of the housing.

7. The electrical enclosure of claim 1, further including a first downwardly extending protrusion positioned on an underside of a first end of the housing cover; and a secnd downwardly extending protrusion positioned on the underside of the first end of the housing cover.

8. The electrical enclosure of claim 7, wherein the first and second downwardly extending protrusions contact a bottom surface of an extension on the circuit board.

9. The electrical enclosure of claim 8, wherein a top surface of the circuit board contacts ledges on a top of a sidewall of the housing, and the circuit board is sandwiched between the first and second downwardly extending protrusions on the underside of the housing cover and the ledges on top of the side wall of the housing.

10. An electrical enclosure comprising:
    a housing having a plurality of side walls and a base;
    a housing cover positioned over, and secured to, the housing;
    a circuit board positioned between the housing and the housing cover;
    a plurality of connectors extending through the housing cover and the circuit board and into the housing, the plurality of connectors securing the housing cover and the circuit board to the housing,
    a first protrusion extending inwardly from a first side wall of the housing, and
    a second protrusion extending inwardly from a second side wall of the housing,
    wherein the first protrusion extends to a first connector receptacle,
    wherein the second protrusion extends to a second connector receptacle; wherein a top of the first protrusion is positioned at a height above the base that is higher than a height of a top of the first connector receptacle positioned above the base; and
    wherein a top of the second protrusion is positioned at a height above the base that is higher than a height of a top of the second connector receptacle positioned above the base.

11. An electrical enclosure comprising:
    a housing having a plurality of side walls and a base;
    a housing cover positioned over, and secured to, the housing;
    a circuit board positioned between the housing and the housing cover;
    a plurality of connectors extending through the housing cover and the circuit board and into the housing, the plurality of connectors securing the housing cover and the circuit board to the housing;
    a first downwardly extending protrusion positioned on an underside of a first end of the housing cover;
    a second downwardly protrusion positioned on the underside of the first end of the housing cover;
    wherein the first and second downwardly extending protrusions contact a bottom surface of the circuit board.

12. The electrical enclosure of claim 11, further including a first protrusion extending inwardly from a first side wall of the housing; and
    a second protrusion extending inwardly from a second side wall of the housing.

13. The electrical enclosure of claim 12, wherein the first protrusion extends to a first connector receptacle; and wherein the second protrusion extends to a second connector receptacle.

14. The electrical enclosure of claim 13, wherein a top of the first protrusion is positioned at a height above the base that is higher than a height of a top of the first connector receptacle positioned above the base; and wherein a top of the second protrusion is positioned at a height above the base that is higher than a height of a top of the second connector receptacle positioned above the base.

15. The electrical enclosure of claim 14, wherein the circuit board is in contact with the tops of the first and second connector receptacles.

16. The electrical enclosure of claim 12, wherein the circuit board includes first and second cutouts that extend around an exterior of the first and second protrusions, respectively.

17. The electrical enclosure of claim 11, wherein the first and second downwardly extending protrusions contact a bottom surface of an extension on the circuit board; and wherein a top surface of the circuit board contacts ledges on a top of a sidewall of the housing, and the circuit board is sandwiched between the first and second downwardly extending protrusions on the underside of the housing cover and the ledges on top of the side wall of the housing.

18. A method comprising:

providing an electrical enclosure having a housing having a plurality of side walls and a base; a housing cover positionable over, and securable to, the housing; a circuit board positionable between the housing and the housing cover; a plurality of connectors extendable through the housing cover and the circuit board and into the housing; a first protrusion extending inwardly from a first side wall of the housing; a second protrusion extending inwardly from a second side wall of the housing; wherein the first protrusion extends to a first connector receptacle; and wherein the second protrusion extends to a second connector receptacle;

positioning the circuit board over the housing and positioning first and second cutouts on the circuit board around an exterior of the first and second protrusions;

positioning the housing cover over the circuit board; and extending the plurality of connectors through the housing cover and circuit board and into the first and second connector receptacles to secure the housing cover and circuit board to the housing.

19. The method of claim 18, further including moving a first downwardly extending protrusion positioned on an underside of a first end of the housing cover and a second downwardly extending protrusion positioned on the underside of the first end of the housing cover into contact with a bottom surface of the circuit board.

20. The method of claim 19, wherein a top surface of the circuit board contacts ledges on a top of a sidewall of the housing, and the circuit board is sandwiched between the first and second downwardly extending protrusions on the underside of the housing cover and the ledges on top of the side wall of the housing.

* * * * *